Figure 1:
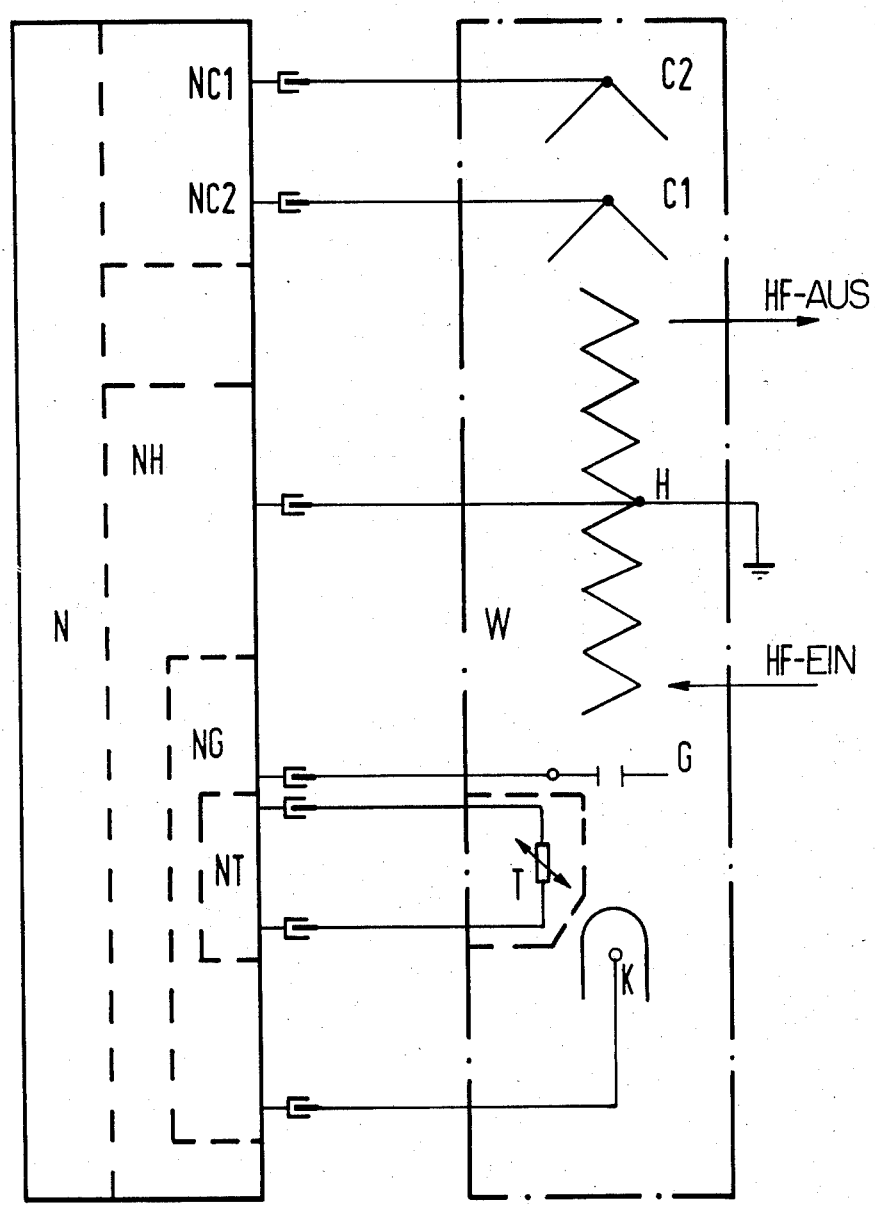

United States Patent [19]

Schmid et al.

[11] Patent Number: 4,638,215
[45] Date of Patent: Jan. 20, 1987

[54] CIRCUIT ASSEMBLY FOR TEMPERATURE-DEPENDENT CATHODE CURRENT TRACKING IN TRAVELING-WAVE TUBES

[75] Inventors: Eckart Schmid, Poing; Ludwig Wanninger, Neubiberg, both of Fed. Rep. of Germany

[73] Assignee: Siemens Aktiengesellschaft, Berlin and Munich, Fed. Rep. of Germany

[21] Appl. No.: 593,953

[22] Filed: Mar. 27, 1984

[30] Foreign Application Priority Data

Mar. 30, 1983 [DE] Fed. Rep. of Germany ....... 3311674

[51] Int. Cl.⁴ ............................................. H01J 25/34
[52] U.S. Cl. ........................................ 315/3.5; 315/3; 315/94; 313/447; 313/13; 324/409
[58] Field of Search ........................... 313/447, 13, 39; 324/409; 315/112, 3.5, 3, 94

[56] References Cited

U.S. PATENT DOCUMENTS 4,471,265 9/1984 Rasmusson ........................... 315/3.5

OTHER PUBLICATIONS

Mouzon, A Simple Temperature Controller, Oct. 1948, 659-662.
Wilson, Multicolored Indicator Light, Aug. 1970, 722.

Primary Examiner—David K. Moore
Assistant Examiner—M. Razavi
Attorney, Agent, or Firm—Herbert L. Lerner; Laurence A. Greenberg

[57] ABSTRACT

A circuit assembly for temperature-dependent cathode current tracking in traveling-wave tubes having control electrodes and cathodes with a predetermined cathode current, in combination with a power supply, includes a temperature-dependent network thermally coupled to a given point of the traveling-wave tube for measuring the actual temperature of the tube, and an electronic control circuit in the power supply connected to the temperature-dependent network for keeping the predetermined cathode current substantially constant by varying the voltage at the control electrode of the tube.

4 Claims, 2 Drawing Figures

CIRCUIT ASSEMBLY FOR TEMPERATURE-DEPENDENT CATHODE CURRENT TRACKING IN TRAVELING-WAVE TUBES

The invention relates to a circuit assembly for temperature-dependent cathode current tracking in traveling-wave tubes and to a traveling-wave tube amplifier.

When applying a constant control voltage, the cathode current and accordingly the gain of a traveling-wave tube is not constant in the event of temperature changes. The reason for this is the temperature-dependent change of the grid-cathode spacing in the tube.

It is accordingly an object of the invention to provide a circuit for temperature-dependent cathode current tracking of the control voltage in traveling-wave tubes, which overcomes the hereinaforementioned disadvantages of the heretofore-known devices of this general type, in order to obtain a relatively constant cathode current as a function of the heating-up of the tube.

With the foregoing and other objects in view there is provided, in accordance with the invention, a circuit assembly for temperature-dependent cathode current tracking in traveling-wave tubes having control electrodes and cathodes with a predetermined cathode current, in combination with a power supply, comprising a temperature-dependent network thermally coupled to a given or suitable point of the traveling-wave tube for measuring the actual temperature of the tube, i.e. the circuit assembly is coupled to the tube, and an electronic control circuit in the power supply connected to the temperature-dependent network for keeping the predetermined cathode current substantially constant by varying the voltage at the control electrode of the tube.

Differently stated, there is provided a traveling-wave tube amplifier, comprising a traveling-wave tube having a control electrode and a cathode with a predetermined cathode current, a power supply, a temperature-dependent network thermally coupled to a given point of the traveling-wave tube for measuring the actual temperature of the tube, and an electronic control circuit in the power supply connected to the temperature-dependent network for keeping the predetermined cathode current substantially constant by varying the voltage at the control electrode of the tube.

In accordance with another feature of the invention, the temperature-dependent network is thermally coupled in vicinity of and sufficiently close to the control electrode determining the cathode current.

The circuit assembly or amplifier according to the invention has the advantage of providing an integrated circuit which is disposed at a suitable point of the tube and is formed of a temperature-dependent network which measures the actual tube temperature and prefereably tracks the G-2-voltage through a control input in the power supply with an electrically conducting connection in such a manner that a cathode current which is constant over a wide temperature range flows in the device and the output power remains accordingly constant.

Other features which are considered as characteristic for the invention are set forth in the appended claims.

Although the invention is illustrated and described herein as embodied in a circuit assembly for temperature-dependent cathode current tracking in traveling-wave tubes, it is nevertheless not intended to be limited to the details shown, since various modifications and structural changes may be made therein without departing from the spirit of the invention and within the scope and range of equivalents of the claims.

Figure 2:
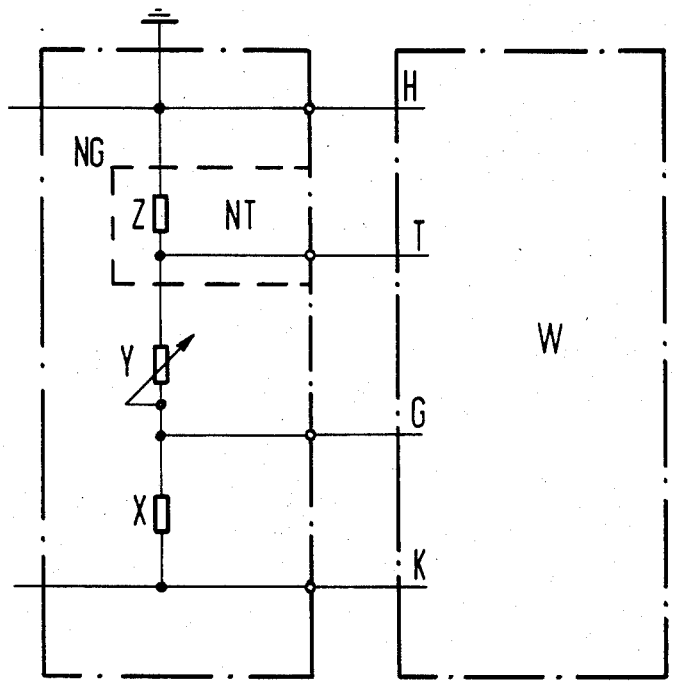

The construction and method of operation of the invention, however, together with additional objects and advantages thereof will be best understood from the following description of specific embodiments when read in connection with the accompanying drawings, in which:

FIG. 1 is a basic schematic circuit diagram of a traveling-wave tube amplifier with temperature compensation; and FIG. 2 is a diagram of the circuit as actually built.

Referring now to the figures of the drawing in detail and first particularly to FIG. 1 thereof, there is seen a basic circuit structure of a traveling-wave tube amplifier with temperature compensation. The amplifier is formed of a power supply N, a traveling-wave tube W and a temperature-dependent network T which measures the actual temperature of the tube. An electronic control circuit is provided in the power supply N, in order to keep the cathode current in the traveling-wave tube W nearly constant by varying the voltage at a control electrode, for instance a control electrode grid G. In this embodiment, the traveling-wave tube W is essentially formed of a cathode K, the control electrode grid G, a helix H and collectors C1 and C2. The power supply N is essentially formed of collector voltage sources NC 1 and NC 2, a helix voltage source NH, a grid voltage source NG and a temperature tracker NT. HF inputs and outputs of the traveling-wave tube W are indicated by arrows designated with reference symbols HF-EIN and HF-AUS, respectively.

In FIG. 2, a circuit as actually built is shown. The circuit is substantially formed of a high-voltage resistance divider X, Y and Z, in which the basic adjustment of the cathode current is accomplished by the resistor Y. The temperature-dependent network T is shunted across the resistor Z in such a manner that the shunt current through the resistors X, Y and Z changes with the change of the resistance in the temperature-dependent network G, and an accompanying voltage change relative to the cathode K takes place at the resistor X. The voltage at the resistor X influences the cathode current through the control input G of the traveling-wave tube W. Corresponding to FIG. 1, the grid voltage source is provided with reference symbol NG and the delay line which is constructed in this embodiment as a helix, is provided with reference symbol H.

The foregoing is a description corresponding in substance to German application No. P 33 11 674.1, filed Mar. 30, 1983, the International priority of which is being claimed for the instant application, and which is hereby made part of this application. Any material discrepancies between the foregoing specification and tne aforementioned corresponding German application are to be resolved in favor of the latter.

We claim:

1. Circuit assembly for temperature-dependent cathode current tracking in traveling-wave tubes having control electrodes and cathodes with a predetermined cathode current, in combination with a power supply, comprising a temperature-dependent network thermally coupled to a given point of the traveling-wave tube for measuring the actual temperature of the tube, and an electronic control circuit in the power supply connected to said temperature-dependent network for keeping the predetermined cathode current substantially constant by varying the voltage at the control electrode of the tube.

2. Circuit assembly according to claim 1, wherein said temperature-dependent network is thermally coupled in vicinity of the control electrode determining the cathode current.

3. Travelling wave tube with control arrangement having a cathode and at least one cathode current-controlling electrode for maintaining the cathode current at a substantially constant value, comprising a temperature-dependent network thermally coupled to the tube for measuring the tube temperature; and an electronic control circuit, being part of the tube's power supply and being operatively responsive to said temperature, controllingly engaging said cathode current-controlling electrode for, by controlling the voltage at said electrode, maintaining the cathode current substantially at said constant value.

4. Travelling wave tube according to claim 3, wherein said network is thermally coupled to the tube at a point at the tube proximal to the control electrode.

* * * * *